April 23, 1968 G. S. BIRD, JR 3,379,577

THERMOELECTRIC JUNCTION ASSEMBLY WITH INSULATING IRREGULAR GRAINS BONDING INSULATING LAYER TO METALLIC THERMOJUNCTION MEMBER

Filed May 1, 1964

INVENTOR.
GORDON S. BIRD, JR.
BY
Roberts, Cushman & Grover,
ATTORNEYS.

3,379,577

THERMOELECTRIC JUNCTION ASSEMBLY WITH INSULATING IRREGULAR GRAINS BONDING INSULATING LAYER TO METALLIC THERMOJUNCTION MEMBER

Gordon S. Bird, Jr., Brighton, Mass., assignor to Cambridge Thermionic Corporation, Cambridge, Mass., a corporation of Massachusetts Filed May 1, 1964, Ser. No. 364,101
4 Claims. (Cl. 136—205)

ABSTRACT OF THE DISCLOSURE

Thermoelectric junction assemblies are fabricated by coating a rigid supporting base means (such as metal or ceramic plates) with an initially tacky insulating cement (such as an epoxy type synthetic), and by forcibly applying insulating grains (such as alumina) to the cement, and then applying to the hardened cement coating a pattern of conductive material (such as vapor deposited copper); the grains are partly embedded in the cement of the coating and partly anchored to the conductive material.

The field of utility of this invention relates to the mechanical construction of thermoelectric apparatus and more particularly to a technique of assembling thermoelements, thermojunction members, and supports therefor.

The construction of the thermoelectric apparatus involving a plurality of thermoelements presents various problems with regard to the mounting of the thermoelements and the connecting thermojunction members on appropriate supports in order to provide a permanently secure assembly withstanding thermal expansion and contraction resulting in plastic deformation and possibly causing mechanical defects and impairment or even interruption of the thermocouple junctions. The heretofore proposed assembly methods using resilient components and conventional bolting, soldering and cementing techniques do not always provide fully satisfactory operation or are too cumbersome or expensive for various practical purposes.

Objects and advantages of the present invention, among others which appear in the context of the description hereinbelow of practical embodiments thereof, are to provide a technique of fabricating assemblies of thermojunction members permanently applied to supporting structures and suitable for convenient and permanently secure joining with thermoelements of any convenient number connected in series or parallel as desired; to provide such a technique which is adaptable to various configurations and combinations of thermoelements without investment in expensive or complex shop fixtures; to provide thermoelectric arrays with excellent electrical characteristics as well as mechanically secure interrelation of the components involved regardless of stresses introduced by differential thermal expansion or by external interference; to provide a very compact permanently assembled thermocouple array suitable for heat pump operations as well as for current generation; and to provide thermoelectric subassemblies adapted for the building of complete thermoelectric arrays suitable for many practical purposes, which subassemblies are simple, rugged, relatively inexpensive in manufacture, and suitable for equally simple, reliable and inexpensive further assembly to form complete thermoelectric apparatus.

The nature and substance of the invention may be shortly stated as being based upon the concept of joining a mechanically rigid support and several thermojunction members by way of a technique which combines cementitious bonding and mechanical anchoring, and produces a reliably permanent joint between support and junction members as well as an outer junction member surface that lends itself very wall for soldering to conventional thermoelements. In accordance with the invention, a rigid support such as a plate is covered with an insulating bonding cement that initially retains a tacky surface. Into this cement are then inserted, pressurably but only partly, irregular particles of granular insulating material, portions of which particles adhere well to the bonding cement whereas projecting free portions offer surface configurations, including undercut projections, which promote the anchoring thereto of vapor deposited material. The granular or powder material is dispersed on the surface of the bonding material as an essentially single layer of closely packed grains such as to provide an optimal maximum of bonded as well as free grain surfaces. The vapor deposited material can thus be forced into, and become firmly anchored to the interstices, undercut portions and irregularities of the grains, which grains are on their other sides, having similar configurations, firmly bonded on the cement layer. The cementing or bonding material can thus be selected for optimal adhesion to the surface of the support as well as to the grains, but regardless of adherence to the vapor deposited material which is mechanically anchored to the grains. The grains become firmly bonded to the cement layer which again is firmly bonded to the plate support, and the vapor deposited material becomes firmly anchored and interlocked in the grains although not bonded thereto or to the cement layer wherever the flame deposited material might reach it. Thus, due to the intermediary of the granular layer, vapor deposited conductive thermojunction members can be firmly secured to the support without reliance on the quality of a single, direct, joint between incompatible surfaces of support and jumpers.

In a preferred embodiment of the invention, the vapor deposited thermojunction members are of generally elongate configuration and are applied by means of stencils in predetermined patterns which may differ for the top and bottom supports, such as plates, of a thermoelectric unit, so that the thermoelements proper can be connected in series by directly joining them to respective thermojunction members of the two plates. Due to the forcible vapor deposition of the junction material on the grain layer, the solidified junction members assume a surface texture which is peculiarly suitable for soldering to thermoelements.

The invention embraces the method according to which the above summarized technique is executed, subassemblies of supporting plates and thermojunction members, and complete assemblies of two support members each with a pattern of vapor deposited thermojunction members, with thermoelements proper firmly interposed, such as by soldering, between the thermojunction members.

These and other objects and aspects of the nature of the invention will appear from the following description of various typical embodiments illustrating its novel characteristics.

The description refers to a drawing in which

FIG. 1 shows the subassembly of thermojunctions with a support plate, which is fabricated as a unit in accordance with the invention and may be sold separately, or further assembled with a cover plate according to FIG. 2, with thermoelements therebetween as shown in FIG. 3.

Figure 4:
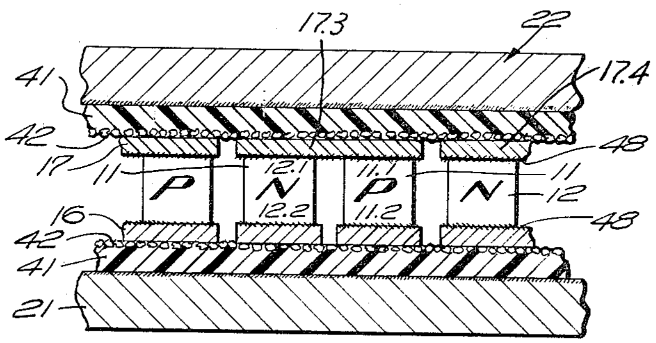
FIG. 4 is a cross section through part of an assembly according to FIG. 3.

In these figures, numerals 11 and 12 designate thermoelements of conventional construction, alternately of the so-called P and N types, respectively, as indicated in FIG. 4. These thermoelements are made of semiconductive material such as bismuth telluride or lead telluride. As well known, the elements of the N type have an excess of electrons in their crystal structure, whereas those of the P type have an excess of electron deficiencies or holes. The P and N elements, respectively, are essentially of the same material, but with different proportions of admixtures. The selection of these elements will depend upon the purpose in question; different types might be preferable for generating electric energy on the one hand, and for purposes of heat pumps on the other hand.

Figure 1:
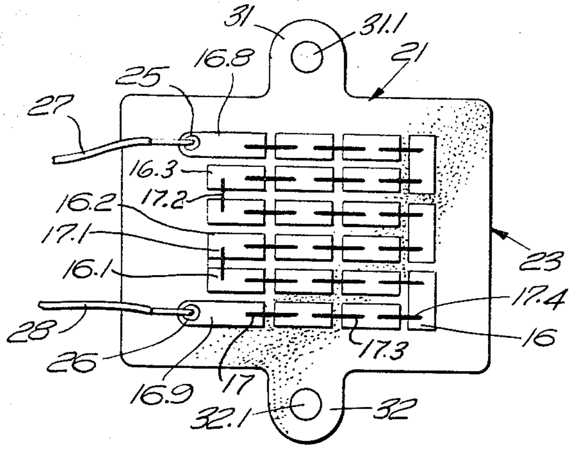
FIG. 1 is a view of a support plate with terminals, according to the invention.

The thermoelements 11, 12 are joined at their junction faces such as indicated at 11.1, 11.2 or 12.1, 12.2 of FIG. 4, to thermojunction members or jumpers 6, 17 on opposite sides respectively, to form thermocouples. The thermojunctions or jumpers 16, 17 are applied to supports such as plates 21 and 22. In the embodiment described, plate 21 is a mounting and terminal plate, and 22 is a cover plate serving no other purpose than locating and holding its jumpers. It will be understood that both support plates can have any desirable configuration for purposes of mounting and heat transfer. FIG. 1 shows the arrangement in a two-dimensional plane of thermojunction members 16, and FIG. 2 similarly shows the arrangement of thermojunction members 17. FIG. 1 also indicates as heavy lines the thermojunction members 17 of FIG. 2 as they will be placed upon superimposition of the two plates. It will be evident that, upon folding of the cover plate according to FIG. 2 over the base plate according to FIG. 1 such as if they were hinged on an axis parallel to their adjacent edges 23, 24, the elements 17.1 and 17.2 indicated in FIG. 2 will be located above thermojunction elements 16.1, 16.2 and 16.3 indicated in FIG. 1. The corresponding numerals as applied to FIG. 3 further indicate this interrelation of thermoelements and thermojunctions. It will now be evident that a continuous series circuit is formed by the thermoelements and thermojunctions or jumpers between the terminals 25 and 26 which are provided by the specially shaped, extended, thermojunction members or terminal jumpers 16.8 and 16.9 as shown in FIGS. 1 and 3 which figures also indicate lead wires 27, 28 soldered to the respective terminal jumpers 16.8 and 16.9.

The mounting plate 21 is preferably provided with fastening means, in the instance ears 31, 32 with holes 31.1 and 32.1 for bolts or similar fastening instrumentalities.

Figure 2:
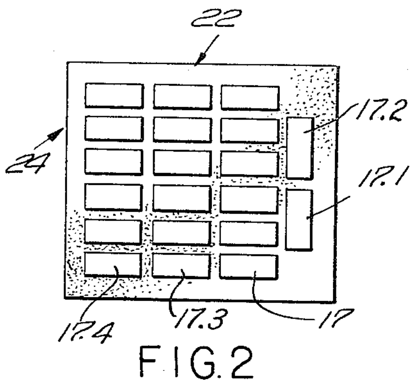
FIG. 2 is a view similar to FIG. 1 of a cover plate, complemental to the terminal plate according to FIG. 1.
Figure 3:
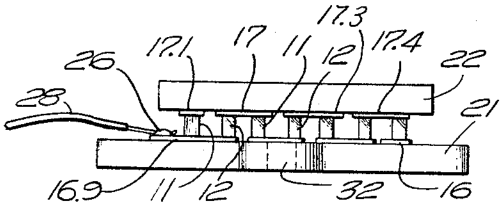
FIG. 3 is a front elevation of a complete thermoelectric unit comprising the terminal and cover plates according to FIGS. 1 to 3 with thermoelements interposed therebetween.
Figure 5:
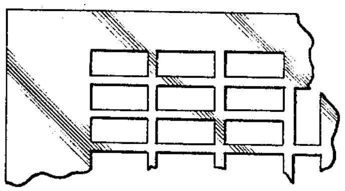
FIG. 5 is a partial view of a stencil used for vapor depositing thermojunction members according to the invention.

The above described structure, illustrated in FIGS. 1 to 3, is in itself conventional; the invention proper, which relates to the joining of thermoelements and thermojunction members will now be described with reference to FIGS. 4 to 6. The technique will first be described in general, and several examples of specific embodiments will then be particularly described.

FIG. 4 which is a section through part of a complete thermoelectric assembly according to FIG. 3, includes the base plate 21, the cover plate 22, and thermoelements such as 11 and 12 which are joined by thermojunction members or jumpers such as 16 and 17. According to the present invention, the jumpers 16, 17 are joined to the plates 21, 22, respectively, as follows.

The plates 21, 22 are made of metal or of a suitable ceramic material. If a considerable potential difference occurs between adjacent plates, it is preferred to use an additional insulation, such as anodized aluminum plates which guard with sufficient safety against breakdown up to voltages of about 2000 volts.

Figure 6:
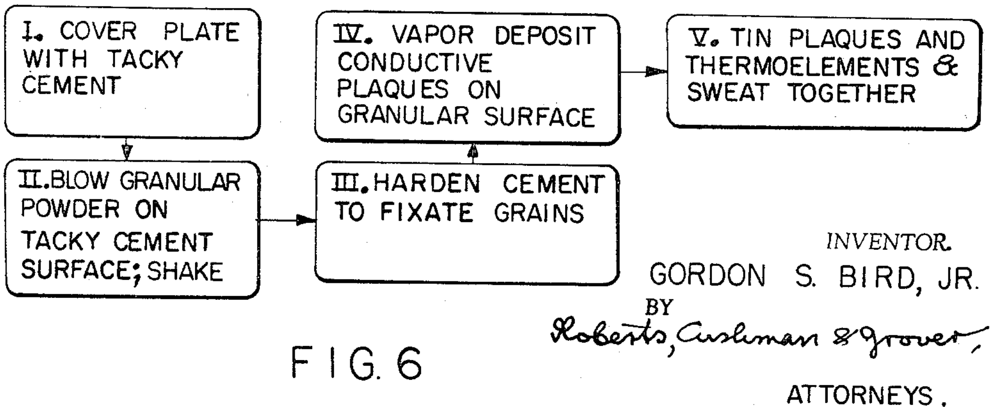
FIG. 6 is a flow sheet illustrating the method according to the invention.

As indicated at I of FIG. 6, the plate is covered with a layer 41 of tacky cement, such as a synthetic polymer of the epoxy type which remains tacky for a sufficient time after application before it is hardened by appropriate treatment such as raising the temperature, commonly referred to as baking.

As indicated at II of FIG. 6, the grains of an insulating powder material are then forcibly applied to the tacky layer, such as blown onto it with an air gun. The grain material selected is hard and practically refractory indestructible. After the grains of the powder have thus been pressed into the tacky cement surface, the grains which remain lose are removed by vigorous shaking so that only discrete grains which are firmly embedded in the cement remain, as indicated at 42.

As indicated at III of FIG. 6, the bonding cement is then hardened by a conventional method suited for the polymer that has been selected. The remaining structure is characterized by a closely packed layer of irregularly shaped particles each of which is firmly embedded in and bonded to the cement which is set and hardened. While the grain structure is not necessarily strictly confined to single grains stacked side by side and there might be some partial superimposition thereof, nevertheless the bonding cement, upon the anchoring grains being pressed thereinto, rises somewhat and pulls in the grains to some extent so that each grain remaining after the shaking of the structure will be firmly bonded to the cement.

After the bonding cement has fully hardened and set, and all grains which are not firmly bonded thereto have been removed, the thermojunction members or jumpers such as 16 of FIG. 1 and 17 of FIG. 2 are added, this step being indicated at IV of FIG. 6. The jumper material is applied with a conventional vaporizing gun, through a stencil resting on the grain layer 42 and exactly prescribing the desired configuration of the jumper plaques, either according to FIG. 1 or according to FIG. 2, or any other desired pattern. A stencil such as shown in FIG. 5 would serve to vapor deposit the thermojunction members 17 of FIG. 2. The plaque material is deposited to a desired thickness which can be determined easily by trial and error for a given type of vapor depositing gun. The stencil thickness is selected to be somewhat greater than the desired jumper plaque thickness. Generally speaking, it can be assumed that approximately one-half of each grain is embedded in and bonded to the cement whereas the other half reaches into and anchors the sprayed-on vapor-deposited material which will contact cement areas at the interstices between the grains.

As indicated at V of FIG. 6, the surface of the vapor deposited upper thermojunction elements is tinned in preparation for soldering. The surface of the vapor-deposited material is not disturbed after its deposition. It was found that plaques of quite uniform thickness can be obtained by carefully distributed and controlled vapor deposition without subsequent machining, and that the undisturbed surfaces of the plaques acquire a texture that is particularly suited for firm solder joints.

The above described method is applied to both plates such as 21 and 22 according to FIGS. 1 and 2, as indicated in FIG. 4 by identical numerals for the respective sides.

The solder is indicated at 48 of FIG. 4, and it will be understood that any suitable fusible material can be used for that purpose.

The faces of thermoelements 11 and 12 are likewise tinned. They are then appropriately placed between the two plates, and the entire structure is sufficiently heated to sweat the surfaces to form a rigidly joined structure.

The leads 25, 26 can be soldered to the extended jumpers 16.8 and 16.9 prior to joining the thermoelements and thermojunction members, or the leads can be soldered on subsequently.

The following specific materials, shop devices, and dimensions have been found suitable for purposes of the invention.

While aluminum supporting and cover plates were found satisfactory, they can be made of other metals such as copper or beryllium copper, or of ceramics such as aluminum oxide or beryllium oxide. As mentioned above, it should be understood that an anodized insulating layer on the faces of aluminum plates, or corresponding insulation on plates of other materials are not necessary unless, as mentioned above, a rather high potential difference is applied thereto.

A preferred granular material is at this time alumina ($Al_2O_3$), however Carborundum (SiC), and crushed quartz or glass are also satisfactory. The grain size is not particularly critical; the standard grit sizes 100, 200 and 600 have been found satisfactory, with 100 preferred at the present time.

As bonding cement, various commercially available epoxy resins of good quality, highly thermoconductive and good insulators are satisfactory, for example "Okun's Original Poxalloy" (registered trademark) available from the A. L. Okun Company of Jamaica, N.Y.

For the vapor-deposited jumper plaques, copper is quite satisfactory, but other good conductors such as silver or nickel can be used, and indeed any sprayable conductor material.

Any sand-blasting tool can be used for pressurably depositing the grains on the tacky cement. For applying the plaques, the "Metro Flame Spray Process" using a gun furnished by Metro Inc. of 1101 Prospect Ave., Westbury, N.Y. was found satisfactory.

The following thicknesses of the components involved have been found satisfactory, but it will be understood that these values are not critical and can be varied in order to suit conditions at hand. Practically successful bonding cement layers are from 0.002 to 0.003 inch thick, and the flame deposited jumpers from 0.003 to 0.012 inch. These dimensions are exclusive of the grains, and taken from the above mentioned interstitial areas where cement layer and metal plaque are in direct contact. In a successful embodiment, the jumper plaques measure 0.300 by 0.160 and 0.330 by 0.160 inch, with spaces therebetween of approximately 0.200 inch. The above indicated jumper thickness is sufficient to handle 10 amperes without resistance heating.

As mentioned above, devices of the herein described type have been successfully used for cooling as well as heating according to the Peltier effect, and also for current generation.

It will be understood that thermoelectric assemblies as herein described can be fastened to supports in any convenient manner, such as by means of the apertured ears 31, 32 of the plate 21. Any suitable means for supplying heat to or abstracting heat from the plates 21, 22 or from similar supporting structures can be applied thereto. It will now be evident that the heat transfer is especially favorable due to the close association of all components, including direct contact between the junction jumpers and the thin heat conductive bonding cement layer.

While forcible application of the jumper conductors by means of a spray process is at this time preferred, it will be understood that other techniques providing intimate and compact interpenetration of jumper material and protruding grain portions are suitable.

It should be understood that the present disclosure is for the purpose of illustration only and that this invention includes all modifications and equivalents which fall within the scope of the appended claims.

I claim:

1. A thermoelectric junction assembly comprising:
rigid supporting base means;
on said base means a hardened coating of thermoconductive, electrically insulating cementitious bonding material capable of hardening from a tacky condition;
on said coating a layer of adjacent discrete, refractory, insulating, irregular grains partly embedded in and bonded to said cementitious material, and partly protruding therefrom;
on said layer a metallic thermojunction member, said grains penetrating partially into the metallic member and being anchored directly thereto; and
a thermoelectric element joined to said thermojunction member.

2. Apparatus according to claim 1, further comprising fusible material between adjoining faces of said thermojunction member and said thermoelectric element.

3. Thermoelectric apparatus comprising:
two plate means;
on each of said plate means a hardened coating of cementitious material of the tacky type;
on each of said coatings a layer of adjacent discrete, refractory, insulating, irregular grains partly embedded in and bonded to said cementitious material, and partly protruding therefrom;
on each of said layers a metallic thermojunction member penetrating partially between, the being anchored to said grains; and
spaced thermoelement means having faces on opposite sides contacting in series the surfaces of respective thermojunction members.

4. Apparatus according to claim 3, further comprising fusible material between adjoining faces of said thermojunction members and said thermoelement means.

References Cited

UNITED STATES PATENTS

| | | | |
|---|---|---|---|
| 969,449 | 9/1910 | Blake | 156—276 |
| 2,264,152 | 11/1941 | Rowland | 117—217 X |
| 2,724,177 | 11/1955 | Coffman et al. | 29—195 X |
| 2,862,838 | 12/1958 | Radley | 117—218 |
| 2,887,971 | 5/1959 | Kalis | 29—195 X |
| 2,925,831 | 2/1960 | Welty et al. | 117—33 X |
| 3,031,344 | 4/1962 | Sher et al. | 117—217 X |
| 3,040,539 | 6/1962 | Gaugler | 136—237 X |
| 3,075,360 | 1/1963 | Elfving et al. | 136—237 X |
| 3,146,125 | 8/1964 | Schneble et al. | 117—217 X |

FOREIGN PATENTS

| | | |
|---|---|---|
| 3,845 | 3/1885 | Great Britain. |
| 5,041 | 12/1878 | Great Britain. |

OTHER REFERENCES

Horn, RCA Technical Note No. 305 (November 1959), 1 page.

ALLEN B. CURTIS, *Primary Examiner.*

WINSTON A. DOUGLAS, *Examiner.*

A. M. BEKELMAN, *Assistant Examiner.*